United States Patent
Nagai et al.

(10) Patent No.: US 6,689,296 B2
(45) Date of Patent: Feb. 10, 2004

(54) CONDUCTIVE PASTE

(75) Inventors: Akira Nagai, Kyotanabe (JP); Fumiya Adachi, Ritto (JP)

(73) Assignee: Murata Manufacturing Co. LTD (JP)

( * ) Notice: Subject to any disclaimer, the term of this patent is extended or adjusted under 35 U.S.C. 154(b) by 0 days.

(21) Appl. No.: 10/277,044

(22) Filed: Oct. 22, 2002

(65) Prior Publication Data

US 2003/0102465 A1 Jun. 5, 2003

(30) Foreign Application Priority Data

Oct. 23, 2001 (JP) ........................... 2001-324468

(51) Int. Cl.[7] .............................. H01B 1/20; H01C 3/00; C01B 35/04
(52) U.S. Cl. .................. 252/519.52; 252/500; 252/506; 252/511; 252/514; 423/297; 501/21; 501/15; 501/96.1; 106/1.14; 106/733
(58) Field of Search .................. 252/511, 514, 252/520.22, 521.3, 500, 506, 519.52; 423/297, 289, 344, 23; 420/429; 501/21, 15, 58, 92, 96.1; 106/1.14, 733; 52/171.2

(56) References Cited

U.S. PATENT DOCUMENTS 5,470,506 A * 11/1995 Tanigami et al. ...... 252/520.22

FOREIGN PATENT DOCUMENTS

| JP | 01-080008 | * 3/1989 | ............ H01G/4/12 |
| JP | 64-081106 | 3/1989 | |
| JP | 05-290623 | 11/1993 | |
| JP | 06-204511 | 7/1994 | |
| JP | 09-092028 | 4/1997 | |
| JP | 10-326522 | 12/1998 | |

* cited by examiner

Primary Examiner—Yogendra N. Gupta
Assistant Examiner—Kallambella M Vijaykumar
(74) Attorney, Agent, or Firm—Dickstein, Shapiro, Morin & Oshinsky, LLP.

(57) ABSTRACT

A conductive paste for defogging heat wires of automobile windows contains a silver powder having particle size in the range of about 0.1 to 20 μm, a molybdenum compound such as molybdenum silicide or molybdenum boride, a glass frit having a softening point of 730° C. or less and an organic vehicle. The conductive paste can uniformly darken the conductive heat wire regions of the automobile window without producing any harmful substances. Also, it can ensure sufficient bonding strength of lead wires.

12 Claims, 1 Drawing Sheet

CONDUCTIVE PASTE

BACKGROUND OF THE INVENTION

1. Field of the Invention

The present invention relates to a conductive paste which is printed on a glass substrate and baked to form defogging heat wires for automobile windows.

2. Description of the Related Art

Automobile windows are provided on the surface thereof with conductive wires for preventing the window from fogging and which are formed by printing and baking a conductive paste. The conductive wires heat up when energized and, thus, prevent the automobile window from fogging. Also, the regions of the window where the conductive wires are disposed have a dark color so as to be nice to look at when viewed from the outside of the automobile.

Such a conductive paste generally contains an additive for darkening the external appearance of the window glass. As this additive, V, Mn, Fe, Co and their oxides (Japanese Unexamined Patent Application Publication No. 5-290623) and Cr, Rh and their oxides (Japanese Unexamined Patent Application Publication No. 9-92028) are known.

However, these additives have problems of (1) making the color of the conductive wire regions of the window nonuniform due to the formation of a low melting point salt resulting from a reaction with part of the silver contained in the conductive paste; (2) degrading solder wettability due to an oxide coming to the surface of conductive wires together with glass after baking, and thus reducing bonding strength of lead wires; (3) being likely to vary the valence of transition metals during baking and, thus, to produce harmful substances; and (4) increasing cost when Rh is used.

SUMMARY OF THE INVENTION

Accordingly, an object of the present invention is to provide a conductive paste for defogging heat wires of an automobile window which uniformly darkens the conductive wire regions of the window, does not produce any harmful substances and ensures sufficient bonding strength of lead wires.

To this end, the present invention is directed to a conductive paste for defogging heat wires of automobile windows. The conductive paste contains a silver powder, a molybdenum compound, a glass frit and an organic vehicle.

According to this composition, the conductive wire regions of the window viewed from the outside of the automobile can efficiently be darkened. Also, by adjusting the content of the molybdenum compound, the specific resistance of the conductive wires can be controlled at a desired level.

Preferably, the molybdenum compound is molybdenum silicide or molybdenum boride.

Preferably, the molybdenum compound content is in the range of about 0.1 to 13 parts by weight relative to 100 parts by weight of the silver powder.

DESCRIPTION OF THE PREFERRED EMBODIMENTS

Figure 1:
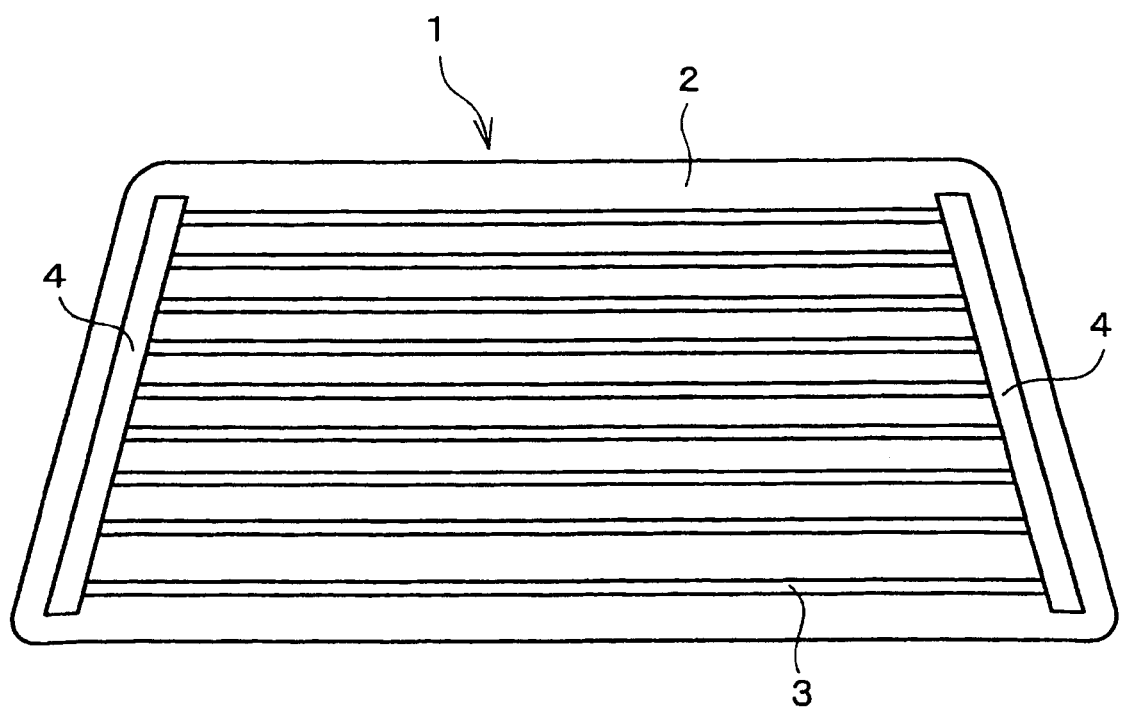
FIG. 1 is a plan view of an automobile rear window having conductive heat wires formed of a conductive paste of the present invention.

An automobile window, for example, a rear window, using a conductive paste according to an embodiment of the present invention has a plurality of conductive heat wires 3 (thick electrodes) and two bus bars 4 (thick electrodes) disposed on a tin film 2 covering a window glass substrate 1, as shown in FIG. 1. The two bus bars 4 are separately formed at each end of the window glass substrate 1. The heat wires 3 are connected to the bus bars 4, and are substantially in parallel with one another. The bus bars 4 and the heat wires 3 are formed by printing the conductive paste according to a predetermined pattern, and by baking it.

The window glass substrate 1 is incorporated into an automobile such that the surface thereof having the printed conductive paste faces the inside of the automobile, thus serving as a rear window. If the rear widow (the window glass substrate 1) fogs, the heat wires 3 are allowed to heat by applying voltage between the two bus bars 4 to energize the heat wires 3. The heat generated by the heat wires 3 eliminates the fogging of the window glass substrate 1. Thus, the heat wires function to prevent the window from fogging. In other words, the heat wires 3 and the bus bars 4 constitute a wire heater. The conductive heat wire regions (the regions of the window glass substrate 1 where the heat wires 3 are disposed) look dark when viewed from the outside of the automobile, and thus the window glass substrate 1 is nice to look at.

The automobile window using the conductive paste of the present invention is not limited to the automobile rear window, and it may be used as side windows and the like.

The conductive paste will now be described in detail.

The conductive paste contains a conductive silver powder, a glass frit, an organic varnish or organic vehicle, and a molybdenum compound.

The particle size of the silver powder is preferably about 20 $\mu$m or less, more preferably about 10 $\mu$m or less, and still more preferably about 5 $\mu$m or less, in order to facilitate the printing of the conductive paste. The lower limit of the particle size of the silver powder is preferably about 0.1 $\mu$m. In order to facilitate the printing and sintering of the silver powder, the silver powder may be constituted by two or more types of silver, such as silver powders or flakes having different particle sizes.

Preferably, the glass frit has a softening point of about 730° C. or less. In other words, it is preferable that the glass frit starts softening and flowing at a temperature lower than the softening point (about 730° C.) of soda-lime glass, which is generally used as the glass substrate. Specifically, low-melting-point glasses, such as $PbO$—$B_2O_3$—$SiO_2$, $Bi_2O_3$—$B_2O_3$—$SiO_2$ and $SiO_2$—$B_2O_3$, are used as the glass frit.

The organic varnish or organic vehicle is prepared by dissolving an organic resin capable of serving as a binder in a solvent, and it is not particularly limited, as long as it facilitates the printing of the conductive paste. The organic resin may contain at least one organic resin selected from the group consisting of ethyl cellulose, nitrocellulose, alkyd resins, acrylic resins, styrene resins and phenol resins. The solvent may contain at least one selected from the group consisting of $\alpha$-terpineol, butyl Carbitol, butyl Carbitol acetate, diacetone alcohol, and methyl isobutyl ketone.

In general, the conductive heat wires 3 are darkened in the process in which, for example, tin ions $Sn^{2+}$ of a tin film covering a glass substrate reduce silver ions move from a thick electrode into the glass substrate to form silver colloid when the thick electrode is formed on the glass substrate by printing and baking a conductive silver paste. Hence, in order to darken the conductive heat wire regions of the window, the formation of the silver colloid must proceed. The silver ions can be dispersed into the glass substrate by ion exchange between the silver ions of the thick electrode and sodium ions of the soda-lime glass substrate.

Chromium oxides have conventionally been used as an additive for darkening the conductive heat wire regions. The inventors disclosed the darkening mechanism by chromium oxides. Specifically, chromium (III) contained in a thick electrode changes in valence in the presence of Na of the glass substrate acting as a catalyst, during baking. This promotes the dispersion of Na from the glass substrate into the thick electrodes. On the other hand, an ion exchange reaction allows a large amount of silver ions to disperse into the glass substrate and thus increases the amount of the silver colloid precipitated. Furthermore, the inventors have found that molybdenum compounds, particularly molybdenum silicide and molybdenum boride whose molybdenum valence is four, have the same effect as chromium oxides.

The conductive paste of the present invention, therefore, contains a molybdenum compound so that the conductive heat wire regions of the window look dark when viewed from the outside of the automobile. Preferably, the molybdenum compound is molybdenum silicide or molybdenum boride. Molybdenum silicide and molybdenum boride do not produce harmful substances, even if their valences are changed. Also, since they can act effectively even when used in a small amount, their oxides do not exude to the baked surface, and thus do not degrade solder wettability.

Preferably, the molybdenum compound content in the conductive paste is in the range of about 0.1 to 13 parts by weight relative to 100 parts by weight of silver powder.

The conductive paste may contain a substance for adjusting the resistance thereof, such as nickel powder, oxide powder or rhodium, if necessary.

EXAMPLES

A silver powder, a glass frit, an organic vehicle and a molybdenum compound were mixed and dispersed with a three-roll mill to prepare a conductive paste. Using this conductive paste, a thick electrode (corresponding to a conductive heat wire) was formed. Then, the darkness of the glass substrate, the specific resistance of the thick electrode and the bonding strength of a lead wire connected to the thick electrode were measured. The methods for measuring the darkness represented by lightness L*, the specific resistance, and the bonding strength of the lead wire will now be described.

The darkness was evaluated based on lightness L*, and a lightness of 30 or less was determined as satisfactory. The conductive paste prepared in the above steps was printed on a slide glass substrate (soda-lime glass, 260 mm×760 mm ×1.4 mm) covered with a tin film so as to form a rectangle of 20 mm in length and 10 mm in width. Then, it was dried at 150° C. for 10 minutes, and subsequently baked at 640° C. for 1 minute to form a thick electrode. The rear surface of the thick electrode (the surface of the thick electrode seen through the glass substrate) was subjected to the measurement of the lightness L* by allowing light having a wave length in the range of 300 to 800 nm to reflect. The measurement was performed with UV-2400 manufactured by Shimadzu Corporation.

The specific resistance and the bonding strength, which are important factors in electrodes (conductive heat wires or thick electrodes) for defrosters, were also measured.

Samples for the measurement of specific resistance were each prepared by printing the conductive paste on a slide glass substrate (soda-lime glass, 260 mm×760 mm×1.4 mm) according to a rectangular resistance-measurement pattern of 200 mm in length and 0.4 mm in width, and subsequently by baking it at 600° C. for 1 minute (in-out: 5 minutes) to form a thick electrode. The resistance and thickness of the thick electrode were measured and the specific resistance was derived from the following equation.

Specific resistance $(\mu\Omega \cdot m) = \{\text{resistance } (\Omega) \times \text{thickness } (\mu m) \times 10^2\}/500$.

The resistance was measured with a multimeter manufactured by Hewlett-Packard Company. The thickness was measured with the contact-type thickness gauge SurfCom manufactured by Tokyo Seimitsu Co., Ltd. The resistance and thickness of each sample were measured five times and the averages were substituted in the above equation.

The bonding strength of the lead wire was measured as follows.

The conductive paste prepared in the above steps was printed on the surface of a slide glass substrate (soda-lime glass, 260 mm ×760 mm ×1.4 mm) in a 2 mm square. Then, it was dried at 150° C. for 10 minutes, and subsequently baked at 600° C. for 1 minute (in-out: 5 minutes) to form a thick electrode. The slide glass substrate having the thick electrode was placed on a plate heated to 150° C., and a lead wire was soldered to the thick electrode.

An L-shaped copper wire of 0.6 mm in diameter with pre-solder was used as the lead wire. The soldering was performed using a Sn—Pb—Ag solder and a flux prepared by dissolving rosin in isopropyl alcohol.

The bonding strength was measured by pulling the lead wire until the lead wire separates from the thick electrode. A practical bonding strength is 10 N or more.

Examples will now be illustrated in detail.

Examples 1 to 4, Comparative Example

In Examples 1 to 4, molybdenum silicide was used as the molybdenum compound. In the Comparative Example, no molybdenum compound was added.

Table 1 shows compositions of the conductive paste and the results of the measurement of the lightness, the specific resistance, and the bonding strength.

TABLE 1

|  | Comparative Example | Example 1 | Example 2 | Example 3 | Example 4 |
|---|---|---|---|---|---|
| Silver powder (parts by weight) | 100 | 100 | 100 | 100 | 100 |
| Glass frit (parts by weight) | 4 | 4 | 4 | 4 | 4 |
| Molybdenum silicide (parts by weight) | 0 | 0.1 | 3 | 7 | 13 |
| Organic vehicle (parts by weight) | 29 | 29 | 29 | 29 | 29 |
| Lightness L* | 35 | 29 | 27 | 26 | 24 |
| Specific resistance ($\mu\Omega \cdot m$) | 3.0 | 3.0 | 3.4 | 4.5 | 11.0 |
| Lead wire bonding strength (N) | 27 | 27 | 25 | 20 | 13 |

Table 1 suggests that by adding molybdenum silicide to the conductive paste, and preferably by adding about 0.1 to 13 parts by weight of molybdenum silicide relative to 100 parts by weight of the silver powder contained in the conductive paste, a thick electrode can be achieved which has excellent properties: a lightness L* of 30 or less; and a bonding strength of 10 N or more.

Table 1 also suggests that the specific resistance can be controlled by varying the molybdenum silicide content.

Examples 5 to 8

In Examples 5 to 8, molybdenum boride was used as the molybdenum compound.

Table 2 shows compositions of the conductive paste and the results of the measurement of the lightness, the specific resistance, and the bonding strength of the lead wire.

TABLE 2

|  | Example 5 | Example 6 | Example 7 | Example 8 |
|---|---|---|---|---|
| Silver powder (parts by weight) | 100 | 100 | 100 | 100 |
| Glass frit (parts by weight) | 4 | 4 | 4 | 4 |
| Molybdenum boride (parts by weight) | 0.1 | 3 | 7 | 13 |
| Organic vehicle (parts by weight) | 29 | 29 | 29 | 29 |
| Lightness L* | 28 | 27 | 25 | 24 |
| Specific resistance ($\mu\Omega \cdot$ m) | 3.0 | 3.0 | 5.5 | 12.0 |
| Lead wire bonding strength (N) | 22 | 27 | 20 | 11 |

Table 2 suggests that by adding molybdenum boride to the conductive paste, and preferably by adding about 0.1 to 13 parts by weight of molybdenum boride relative to 100 parts by weight of the silver powder contained in the conductive paste, a thick electrode can be achieved which has excellent properties: a lightness L* of 30 or less; and a bonding strength of 10 N or more.

Table 2 also suggests that the specific resistance can be controlled by varying the molybdenum boride content.

As described above, the conductive paste of the present invention contains a silver powder, a molybdenum compound, a glass frit and an organic vehicle. According to this composition, a conductive paste for defogging heat wires of an automobile window can be achieved which uniformly darkens the conductive heat wire regions of the automobile window, does not produce any harmful substances, and ensures sufficient bonding strength of lead wires.

What is claimed is:

1. A conductive paste for defogging heat wires of automobile windows, comprising:

a silver powder;

molybdenum boride;

a glass frit; and an organic vehicle.

2. The conductive paste according to claim 1, wherein the molybdenum boride content is in the range of about 0.1 to 13 parts by weight relative to 100 parts by weight of the silver powder.

3. The conductive paste according to claim 2, wherein the particle size of the silver powder is in the range of about 0.1 to 20 μm.

4. The conductive paste according to claim 3, wherein the softening point of the glass frit is about 730° C. or less.

5. The conductive paste according to claim 1, wherein the particle size of the silver powder is in the range of about 0.1 to 20 μm.

6. The conductive paste according to claim 5, wherein the softening point of the glass frit is about 730° C. or less.

7. The conductive paste according to claim 1, wherein the softening point of the glass frit is about 730° C. or less.

8. The conductive paste according to claim 1, wherein the particle size of the silver powder is in the range of about 0.1 to 10 μm.

9. The conductive paste according to claim 8, wherein the particle size of the silver powder is in the range of about 0.1 to 5 μm.

10. The conductive paste according to claim 9, wherein the softening point of the glass frit is about 730° C. or less.

11. The conductive paste according to claim 9, wherein the glass is a borosilicate.

12. The conductive paste according to claim 6, wherein the glass is a borosilicate.

* * * * *